(12) United States Patent
Drowley et al.

(10) Patent No.: US 7,427,742 B2
(45) Date of Patent: Sep. 23, 2008

(54) MICROLENS FOR USE WITH A SOLID-STATE IMAGE SENSOR AND A NON-TELECENTRIC TAKING LENS

(75) Inventors: Clifford I. Drowley, Scottsdale, AZ (US); Chin-Chun Wang, Lexington, MA (US)

(73) Assignee: Cypress Semiconductor Corporation, San Jose, CA (US)

( * ) Notice: Subject to any disclaimer, the term of this patent is extended or adjusted under 35 U.S.C. 154(b) by 887 days.

(21) Appl. No.: 10/685,140

(22) Filed: Oct. 14, 2003

(65) Prior Publication Data

US 2004/0165097 A1 Aug. 26, 2004

Related U.S. Application Data

(60) Provisional application No. 60/417,982, filed on Oct. 11, 2002.

(51) Int. Cl.
*H01J 3/14* (2006.01)
(52) U.S. Cl. ............... 250/216; 250/208.1; 257/432; 257/229; 257/294
(58) Field of Classification Search ........... 250/208.1, 250/214.1, 216; 257/432, 229, 294; 348/273–275
See application file for complete search history.

(56) References Cited

U.S. PATENT DOCUMENTS 5,610,390 A 3/1997 Miyano (Continued)

FOREIGN PATENT DOCUMENTS

| EP | 1 107 316 A2 | 6/2001 |
| EP | 1 213 764 A2 | 6/2002 |
| JP | 2001/160973 | 6/2001 |

OTHER PUBLICATIONS

"A 256×256 CMOS Imaging Array with Wide Dynamic Range Pixels and Column-Parallel Digital Output," Decker et al. *IEEE Journal of Solid-State Circuits*. Dec. 1998. vol. 33, No. 12.

(Continued)

*Primary Examiner*—Stephen Yam
(74) *Attorney, Agent, or Firm*—Blakely, Sokoloff, Taylor & Zafman LLP

(57) ABSTRACT

An imager includes a two-dimensional array of photosensors, each photosensor having a center point. A non-telecentric lens is positioned over the two-dimensional array of photosensors, and a two-dimensional array of microlenses is positioned over the two-dimensional array of photosensors. Each microlens is associated with a corresponding photosensor, and each microlens has a center point. A color filter array is positioned over the two-dimensional array of photosensors. The color filter array includes a plurality of color filter areas. Each color filter area is associated with a corresponding photosensor and has a center point. A layer of transmissive apertures is further positioned over the two-dimensional array of photosensors. Each aperture is associated with a corresponding photosensor and having a center point. The microlens is positioned over the corresponding photosensor such that the center point of the microlens is offset from the center point of the corresponding photosensor. The color filter area is positioned over the corresponding photosensor such that the center point of the color filter area is offset from the center point of the corresponding photosensor. Finally, the aperture is positioned over the corresponding photosensor such that the center point of the aperture is offset from the center point of the corresponding photosensor.

14 Claims, 11 Drawing Sheets

U.S. PATENT DOCUMENTS

| | | | |
|---|---|---|---|
| 5,682,203 A | 10/1997 | Kato | |
| 5,734,155 A * | 3/1998 | Rostoker | 250/208.1 |
| 5,986,704 A | 11/1999 | Asai et al. | |
| 6,008,511 A | 12/1999 | Tokumitsu et al. | |
| 6,344,666 B1 * | 2/2002 | Yamaguchi et al. | 257/98 |
| 6,518,640 B2 * | 2/2003 | Suzuki et al. | 257/432 |
| 6,642,965 B1 * | 11/2003 | Nagata et al. | 348/340 |
| 2001/0026322 A1 * | 10/2001 | Takahashi et al. | 348/340 |
| 2003/0071271 A1 | 4/2003 | Suzuki et al. | |

OTHER PUBLICATIONS

"Autobrite: Method for Controlling the Dynamic Range of an Image Sensor," *SMAL Camera Technologies*. Dec. 7, 2001.

PCT International Search Report, PCT/US03/32219 filed Sep. 10, 2003, mailed Feb. 27, 2004.

* cited by examiner

MICROLENS FOR USE WITH A SOLID-STATE IMAGE SENSOR AND A NON-TELECENTRIC TAKING LENS

PRIORITY INFORMATION

This application claims priority from U.S. Provisional Patent Application, Ser. No. 60/417,982, filed on Oct. 11, 2002. The entire contents of U.S. Provisional Patent Application, Ser. No. 60/417,982 are hereby incorporated by reference.

FIELD OF THE PRESENT INVENTION

The present invention relates generally to image sensing technology. More specifically, the present invention relates to a CMOS image sensor that uses shifted microlenses, color filter areas, and apertures to increase the light collection efficiency of a photosensor or photodiode as well as decreasing color signal crosstalk between adjacent pixels.

BACKGROUND OF THE PRESENT INVENTION

Conventionally, imaging technology has been centered around charge coupled device (CCD) image sensors. However, recently, CMOS imaging technology has become increasingly the technology of choice. There are a variety of reasons for this progression.

First, CCD imagers require specialized facilities, which are dedicated exclusively to the fabrication of CCDs. Second, CCD imagers consume a substantial amount of power, since they are essentially capacitive devices, which require external control signals and large clock swings to achieve acceptable charge transfer efficiencies. Third, CCD imagers require several support chips to operate the device, condition the image signal, perform post processing, and generate standard video output. This need for additional support circuitry makes CCD systems complex. Finally, CCD systems require numerous power supplies, clock drivers and voltage regulators, which not only further increase the complexity of the design, but also demand the consumption of additional significant amounts of power.

By contrast, CMOS imagers are characterized by a less complex design. The more simple architecture translates into a reduction in engineering and production costs and a concomitant and substantial reduction in power consumption. With today's submicron CMOS fabrication processes, CMOS imagers have also become highly integrated. For example, an entire CMOS-based imaging system, such as a digital camera, can be fabricated on a single semiconductor chip. Additionally, unlike CCD imagers, CMOS imagers are amenable to fabrication in standard CMOS fabrication facilities. This adaptability significantly reduces plant over-head costs. For these reasons, CMOS imagers are swiftly becoming the imagers of choice.

An image sensor is comprised of an array of picture elements or "pixels," wherein each pixel comprises a photodiode or photosensor. A layout for an exemplary CMOS unit pixel 10 is shown in FIG. 1. Unit pixel 10 is comprised of a rectangular image sensing area 100, transfer transistor 102, floating node 104, reset transistor 106, drive transistor 108, select transistor 110, and output 112. Unit pixel 10 is powered by power supply VDD 114. Image sensing area 100 is made rectangular to maximize the "fill factor," which is defined as the percentage of the unit pixel 10 area occupied by image sensing area 100. A typical fill factor for the arrangement of FIG. 1 is approximately 30%.

Referring now to FIG. 2, there is shown a plan view of a partial array of pixels 20, according to conventional CMOS image sensor devices. By positioning cylindrically shaped microlenses 203 over image sensing areas 200, the effective fill factor for the layout of FIG. 1 can be improved, as incident light 204 is focused more towards the center of rectangular image sensing areas 200 by microlenses 203. The percentage of each unit pixel 20 occupied by each image sensing area 200 does not, of course, change by employment of microlenses 203. Nevertheless, light capture is improved and the effective fill factor is increased. Use of cylindrically shaped microlenses 203 can increase the effective fill factor to approximately 75%.

Despite the improvement in effective fill factor using cylindrically shaped microlenses, there are negative performance factors, which are attributable to use of rectangular-shaped image sensing areas and cylindrically-shaped microlenses.

First, referring to FIG. 2, whereas utilization of cylindrically shaped microlenses 203 is effective at directing incident light 204 arriving at angles perpendicular to the major axes (major axes are in x-direction) of the lenses 203, the cylindrically shaped microlenses 203 are not very effective at focusing incident light 204 arriving at angles non-perpendicular to, i.e. oblique to, the major axes of the cylindrically shaped microlenses 203. This ineffectiveness further involves light that is scattered and/or reflected and which ultimately arrives at the lenses 203 at oblique angles.

The ineffectiveness of cylindrically shaped microlenses 203 to focus incident light towards the center of the image sensing areas 200 is problematic due to the fact that neighboring rectangular-shaped image sensing areas are in close proximity in the x-direction, where the horizontal spacing between neighboring pixels is shown to be approximately 0.8 μm. The close proximity results in random diffusion of photocharge generated outside the photodiode depletion regions. Photocharge that is generated outside the depletion region of a particular pixel is prone to capture by a neighboring pixel. When photocharge is unwanted captured by an adjacent pixel, electrical crosstalk occurs resulting in a reduction in image sharpness.

There is another type of crosstalk that can be attributed to the close proximity of neighboring rectangular-shaped image sensing areas 200. This second type of crosstalk occurs between pixels of different colors and is referred to in the art as "color crosstalk." Color crosstalk leads to color distortion and is largely caused by the fact that silicon-based photodiodes have a wavelength-dependent photon absorption response.

In particular, color distortion can be significant for image arrays that use rectangular-shaped image sensing areas together with an RGB Bayer pattern color filter. In fact, a difference on the order of 10% in the response of $G_R$, (green pixels adjacent to red pixels in the same row) and $G_B$, (green pixels adjacent to blue pixels in the same row), under uniform illumination, is observed when rectangular-shaped image sensing areas are used. This difference in green pixel responsivity results in color distortion.

Finally, yet another problem that is observed when neighboring image-sensing areas are too closely positioned, is a decrease in spatial resolution. In imaging systems, resolution is quantified in terms of a modulation transfer function (MTF). The lower the MTF, the less capable an imaging device is at picking up the fine detail and contrast in the object that is being imaged.

In furtherance of the above discussion, a digital imaging system for photographic, video, or other imaging applications generally includes two major components, a solid-state imaging device and a taking lens. Solid-state imaging devices, such as charge-coupled devices or CMOS image sensors, are typically constructed as two-dimensional arrays of photo-sensing elements, i.e., pixels. In an example CMOS image sensor, each CMOS pixel usually contains a photodiode as the sensing element, and this sensing element is typically embedded in a circuit with several MOS transistors. The other important part of the imaging system is taking lens. A taking lens is typically constructed of a multi-element glass, plastics, or glass-plastic hybrid lens assembly and generally employed in front of the imaging device to focus the light onto the sensor array.

The performance of an imaging system strongly depends on the light collection efficiency of the sensor. For the aforementioned example CMOS image sensor, the light collection efficiency is determined by the ratio of the photodiode area to the total pixel area, called "fill factor." A large fill factor is generally desired to increase the optical energy incident on the pixel that can be collected by the photodiode. However, the maximum achievable fill factor is limited by the CMOS fabrication design rules between photodiodes and MOS transistors. An example of this is illustrated in FIG. 3.

As illustrated in FIG. 3, an area of silicon 30 corresponding to a pixel area or site contains a photodiode 35. This pixel site or area is usually covered by a dielectric 40. Incident light 50 from an image to be captured passes through the dielectric layer 40 and impinges upon the area of silicon 30 containing the photodiode 35. As further illustrated, not all of the incident light 50 impinges upon the photodiode 35, thus the ratio of incident light 50 to that light which impinges upon the photodiode 35 is the light collection efficiency.

As the pixel size (300 & 400) is scaled down, as illustrated in FIG. 4, to reduce the die size or increase the sensor resolution with a fixed die size in order to achieve some financial benefits, the area of the photodiode 350 needs to be shrunk further in accordance to the layout design rules. As a result, the fill factor is reduced and the sensor performance is degraded.

In order to compensate for the degraded light collection efficiency for small fill-factor pixels, a microlens 60, as illustrated in FIG. 5, has conventionally been placed over a pixel (300 & 400) to refract light hitting on the surface of the pixel (400) into the photodiode 350. As shown in FIG. 5, the microlens 60 concentrates light 500 from the taking lens onto the photodiode 350, improving light collection efficiency and increasing the effective fill factor.

The effectiveness of the microlens 60 is influenced by the telecentricity of the taking lens. For slim cameras with thin lens assemblies, the taking lens 90 tends to be non-telecentric, as illustrated in FIG. 7. That means the light rays 85 will impinge on the sensors 70 with a large incident angle. On the other hand, using a telecentric lens 80, as illustrated in FIG. 6, the light rays 82 impinge on the sensors 70 with a small incident angle. The angle is typically measured using chief rays, as shown in FIGS. 6 and 7. In typical lens considered for ⅓" SXGA sensor applications, the chief ray angle is 12°-23°.

The effect of a large chief ray angle, as illustrated in FIG. 7, on an array with microlenses is significant. The incident angle causes the focus spot to shift away from the photodiode site as a function of pixel distance from the optical center of the array. This phenomenon is demonstrated in FIGS. 8 and 9.

As illustrated in FIG. 8, incident light 550 from a telecentric lens impinges upon a microlens 60 that focuses the light through a dielectric layer 40 onto a pixel site 30 in which a photodiode 35 is located. Since the angle of the incident light 550, as illustrated in FIG. 8, is small, the light collection efficiency is high. On the other hand, in FIG. 9, when using a non-telecentric lens, the incident light 560 impinges upon a microlens 60 that focuses the light through a dielectric layer 40 onto a pixel site 30 in which a photodiode 35 is located. As illustrated in FIG. 9, since the angle of the incident light 560 is large relative to FIG. 8, the microlens 60 shifts the focused light to a corner of the pixel site 30 so that the light collection efficiency is significantly reduced.

Therefore, it is desirable to provide an imager in which a non-telecentric lens can be used without reducing the light collection efficiency of the pixel site.

SUMMARY OF THE PRESENT INVENTION

A first aspect of the present invention is an imager. The imager includes a two-dimensional array of photosensors, each photosensor having a center point and a two-dimensional array of microlenses positioned over the two-dimensional array of photosensors, each microlens being associated with a corresponding photosensor, each microlens having a center point. The microlens is positioned over the corresponding photosensor such that a center point of a microlens is offset, in a first direction, from a center point of a corresponding photosensor.

A second aspect of the present invention is an imager. The imager includes a two-dimensional array of photosensors, each photosensor having a center point and a color filter array positioned over the two-dimensional array of photosensors, the color filter array including a plurality of color filter areas, each color filter area being associated with a corresponding photosensor and having a center point. The color filter area is positioned over a corresponding photosensor such that a center point of a color filter area is offset, in a first direction, from a center point of a corresponding photosensor.

A third aspect of the present invention is an imager. The imager includes a two-dimensional array of photosensors, each photosensor having a center point and a layer of transmissive apertures positioned over the two-dimensional array of photosensors, each aperture being associated with a corresponding photosensor and having a center point. The aperture is positioned over the corresponding photosensor such that a center point of a aperture is offset, in a first direction, from a center point of a corresponding photosensor.

A fourth aspect of the present invention is an imager. The imager includes a two-dimensional array of photosensors, each photosensor having a center point; a two-dimensional array of microlenses positioned over the two-dimensional array of photosensors, each microlens being associated with a corresponding photosensor, each microlens having a center point; a color filter array positioned over the two-dimensional array of photosensors, the color filter array including a plurality of color filter areas, each color filter area being associated with a corresponding photosensor and having a center point; and a layer of transmissive apertures positioned over the two-dimensional array of photosensors, each aperture being associated with a corresponding photosensor and having a center point. The microlens is positioned over the corresponding photosensor such that a center point of a microlens is offset, in a first direction, from a center point of a corresponding photosensor. The color filter area is positioned over the corresponding photosensor such that a center point of a color filter area is offset, in the first direction, from a center point of a corresponding photosensor. The aperture is positioned over the corresponding photosensor such that a center point of a aperture is offset, in the first direction, from a center point of the corresponding photosensor.

A fifth aspect of the present invention is an imaging system. The imaging system includes a two-dimensional array of photosensors, each photosensor having a center point; a non-telecentric lens positioned over the two-dimensional array of photosensors; and a two-dimensional array of microlenses positioned over the two-dimensional array of photosensors, each microlens being associated with a corresponding photosensor, each microlens having a center point. The microlens is positioned over the corresponding photosensor such that a center point of a microlens is offset from a center point of a corresponding photosensor, each offset having an amount and a direction such that the amounts and directions spatially vary across the two-dimensional array of photosensors. The spatial variation is determined based on optical characteristics of the non-telecentric lens and optical properties of the two-dimensional array of photosensors and the microlenses such that light sensitivity of each pixel is maximized.

A sixth aspect of the present invention is an imaging system. The imaging system includes a two-dimensional array of photosensors, each photosensor having a center point; a non-telecentric lens positioned over the two-dimensional array of photosensors; and a color filter array positioned over the two-dimensional array of photosensors, the color filter array including a plurality of color filter areas, each color filter area being associated with a corresponding photosensor and having a center point. The color filter area is positioned over the corresponding photosensor such that the center point of the color filter area is offset from the center point of the corresponding photosensor, each offset having an amount and a direction such that the amounts and directions spatially vary across the two-dimensional array of photosensors. The spatial variation is determined based on optical characteristics of the non-telecentric lens and optical properties of the two-dimensional array of photosensors and the color filter areas such that crosstalk is minimized.

A seventh aspect of the present invention is an imaging system. The imaging system includes a two-dimensional array of photosensors, each photosensor having a center point; a non-telecentric lens positioned over the two-dimensional array of photosensors; and a layer of transmissive apertures positioned over the two-dimensional array of photosensors, each aperture being associated with a corresponding photosensor and having a center point. The aperture is positioned over the corresponding photosensor such that the center point of the aperture is offset from the center point of the corresponding photosensor, each offset having an amount and a direction such that the amounts and directions spatially vary across the two-dimensional array of photosensors. The spatial variation is determined based on optical characteristics of the non-telecentric lens and optical properties of the two-dimensional array of photosensors and the apertures such that stray light signals are minimized.

Another aspect of the present invention is an imaging system. The imaging system includes a two-dimensional array of photosensors, each photosensor having a center point; a non-telecentric lens positioned over the two-dimensional array of photosensors; a two-dimensional array of microlenses positioned over the two-dimensional array of photosensors, each microlens being associated with a corresponding photosensor, each microlens having a center point; a color filter array positioned over the two-dimensional array of photosensors, the color filter array including a plurality of color filter areas, each color filter area being associated with a corresponding photosensor and having a center point; and a layer of transmissive apertures positioned over the two-dimensional array of photosensors, each aperture being associated with a corresponding photosensor and having a center point. The microlens is positioned over the corresponding photosensor such that the center point of the microlens is offset from the center point of the corresponding photosensor, each microlens offset having an amount and a direction such that the amounts and directions spatially vary across the two-dimensional array of photosensors. The color filter area is positioned over the corresponding photosensor such that the center point of the color filter area is offset from the center point of the corresponding photosensor, each color filter area offset having an amount and a direction such that the amounts and directions spatially vary across the two-dimensional array of photosensors. The aperture is positioned over the corresponding photosensor such that the center point of the aperture is offset, in the first direction, from the center point of the corresponding photosensor, each aperture offset having an amount and a direction such that the amounts and directions spatially vary across the two-dimensional array of photosensors. The spatial variation of the microlens offsets is determined based on optical characteristics of the non-telecentric lens and optical properties of the two-dimensional array of photosensors and the microlenses such that light sensitivity of each pixel is maximized. The spatial variation of the color filter area offsets is determined based on optical characteristics of the non-telecentric lens and optical properties of the two-dimensional array of photosensors and the color filter areas such that crosstalk is minimized. The spatial variation of the aperture offsets is determined based on optical characteristics of the non-telecentric lens and optical properties of the two-dimensional array of photosensors and the apertures such that stray light signals are minimized.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
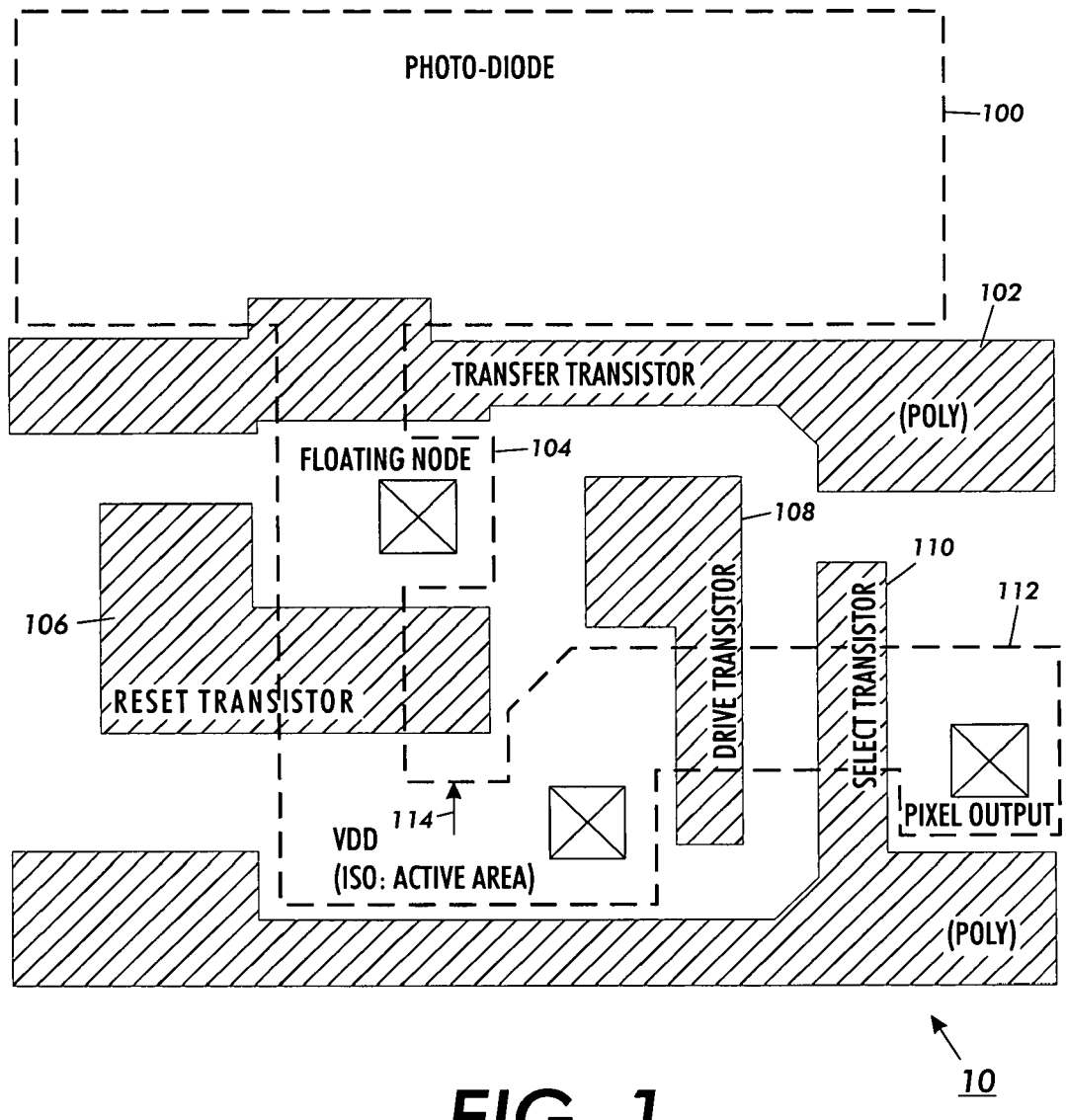
FIG. 1 is a layout view of a unit pixel for a typical CMOS image sensor.
Figure 2:
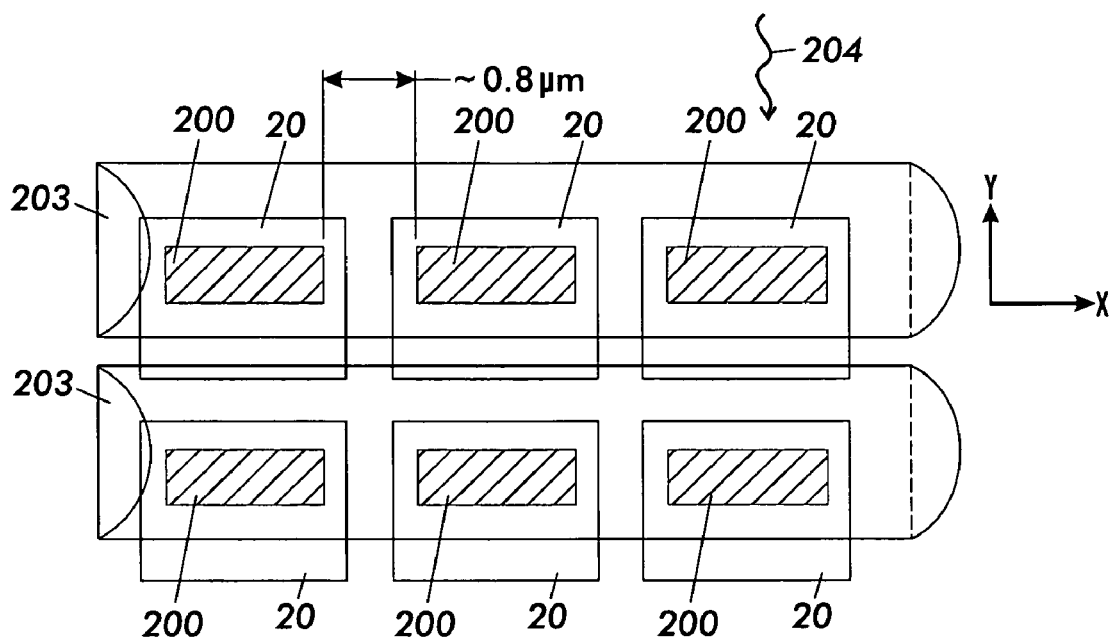
FIG. 2 illustrates a partial array of pixels employing cylindrically shaped microlenses over image sensing areas.
Figure 3:
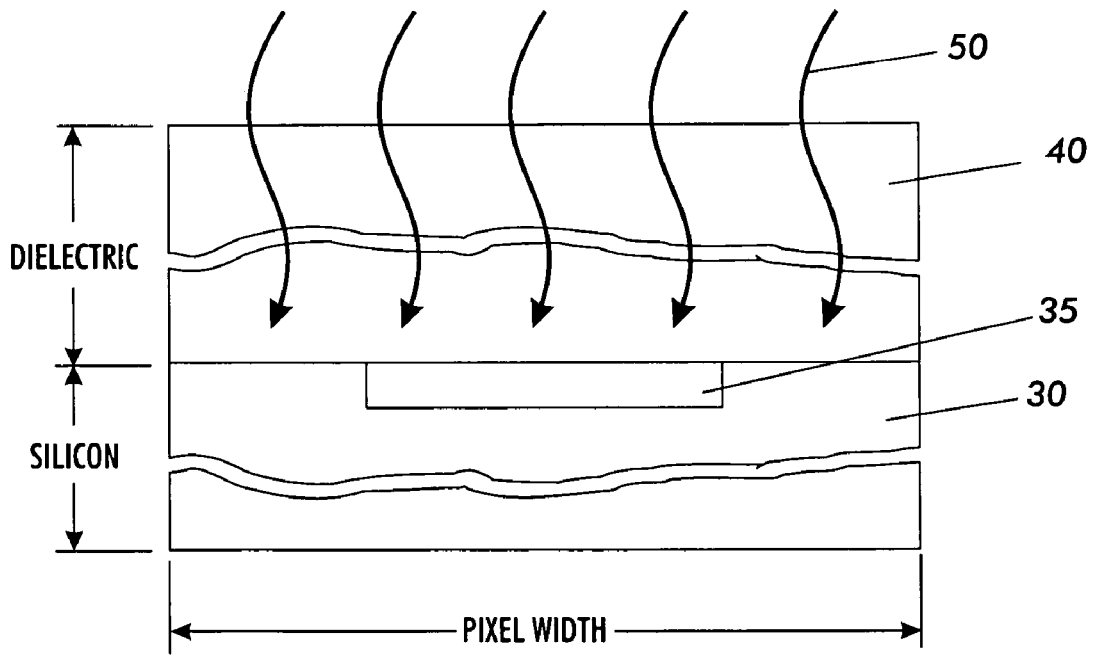
FIG. 3 graphically illustrates light collection efficiency of a pixel.
Figure 4:
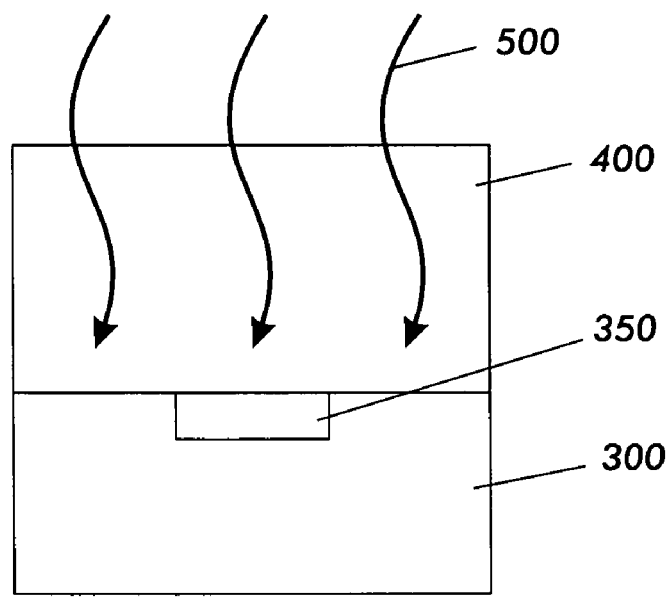
FIG. 4 graphically illustrates light collection efficiency of a scaled down pixel.
Figure 5:
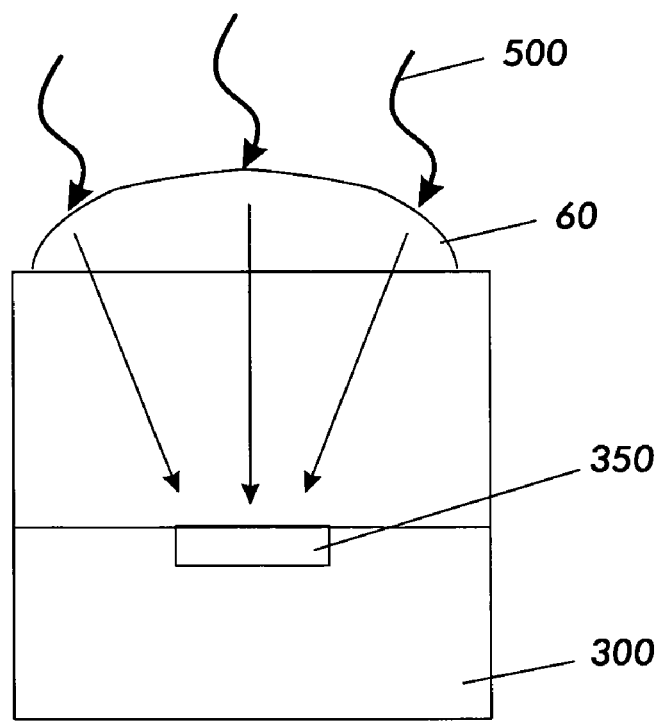
FIG. 5 graphically illustrates light collection efficiency of a scaled down pixel with a microlens position above it.
Figure 6:
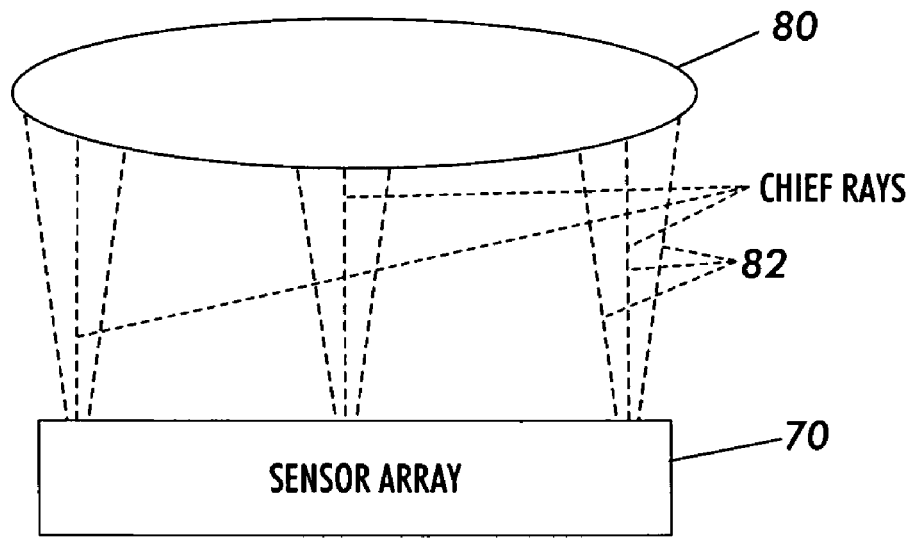
FIG. 6 illustrates small chief ray angles for telecentric lens.
Figure 7:
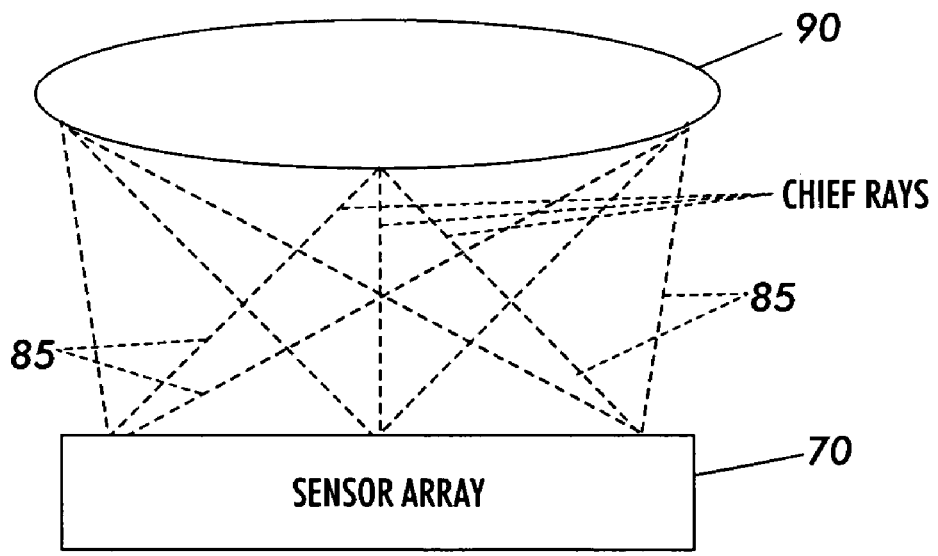
FIG. 7 illustrates large chief ray angles for non-telecentric lens.
Figure 8:
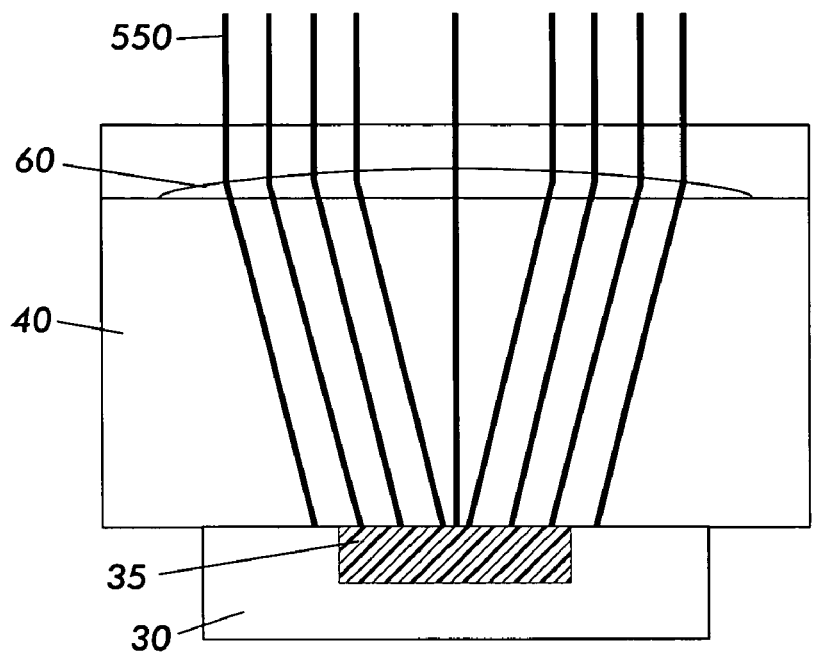
FIG. 8 graphically illustrates light collection efficiency of an imager with telecentric lens.
Figure 9:
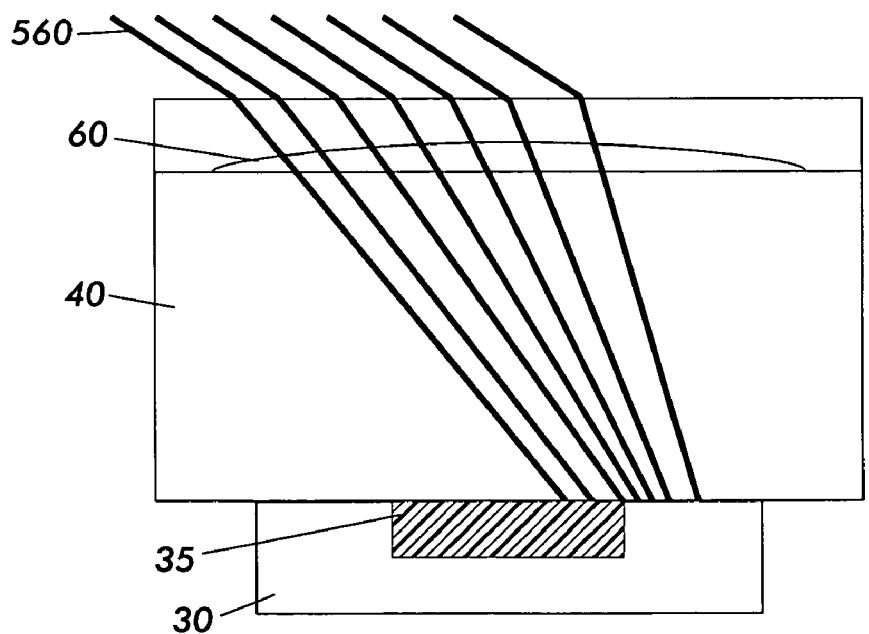
FIG. 9 graphically illustrates light collection efficiency of an imager with non-telecentric lens.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

Figure 10:
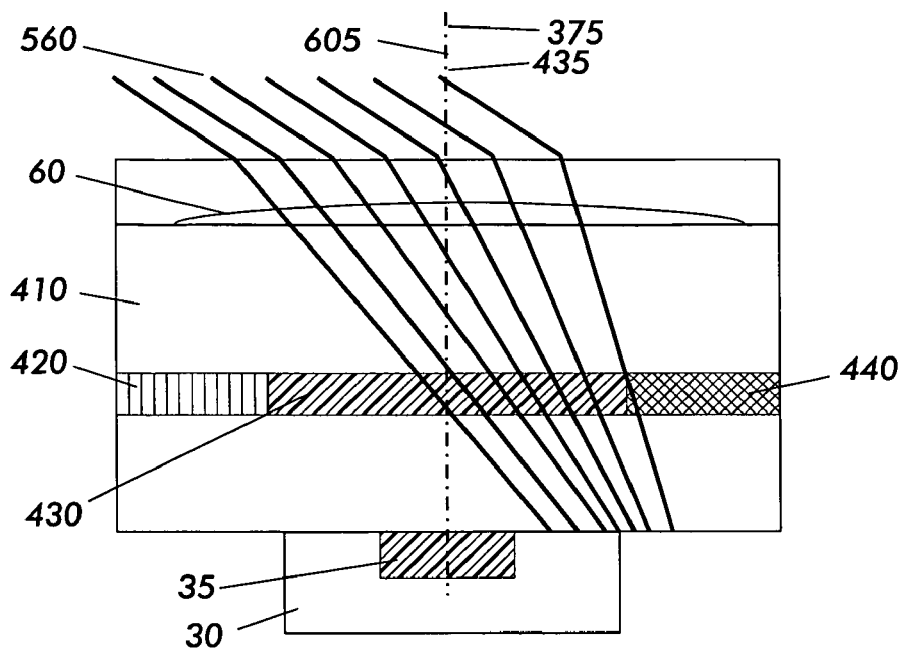
FIG. 10 graphically illustrates another example of light collection efficiency of an imager with non-telecentric lens, a non-shifted microlens, and a non-shifted color filter array layer.

As noted above, when using a non-telecentric lens, the incident light encounters the pixel site at large angles, which can adversely affect the light collection efficiency. As illustrated in FIG. 10, an example of an imager using a non-telecentric lens is shown. Light 560, from a non-telecentric lens (not shown) impinges upon a microlens 60 that focuses the light through a dielectric layer 410 and a color filter array layer having color filter areas 420, 430, and 440. Upon leaving color filter array layer, the light passes through another dielectric layer before being incident upon a pixel site 30 in which a photodiode 35 is located. As illustrated in FIG. 10, since the angle of the incident light 560 is large, the microlens 60 shifts the focused light to a corner of the pixel site 30 so that the light collection efficiency is significantly reduced. It noted that in the example of FIG. 10, the pixel site 30 has a center point or center line 375, and the microlens 60 has a center point or center line 605. These center lines 375 and 605 are lined up so that there is no physical offset between them.

In order to compensate for the lens spot shift, in accordance with the present invention, the microlens is shifted in the opposite direction in order to bring the focus spot back onto the photodiode. This shift is illustrated in FIG. 11.

Figure 11:
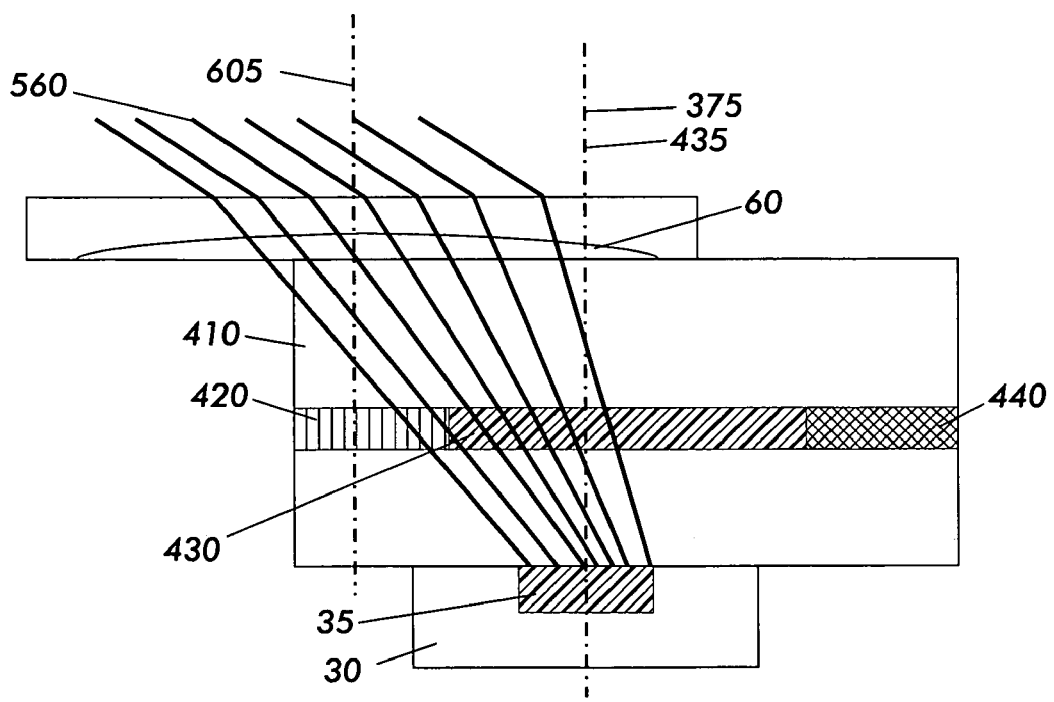
FIG. 11 graphically illustrates an example of light collection efficiency of an imager with non-telecentric lens and a non-shifted color filter array layer with a shifted microlens according to the concepts of the present invention.

As illustrated in FIG. 11, light 560, from a non-telecentric lens (not shown) impinges upon a shifted or offset microlens 60 that focuses the light through a dielectric layer 410 and a color filter array layer having color filter areas 420, 430, and 440. Upon leaving color filter array layer, the light passes through another dielectric layer before being incident upon a pixel site 30 in which a photodiode 35 is located. It noted that in the example of FIG. 11, the pixel site 30 has a center point or center line 375, and the microlens 60 has a center point or center line 605. Since the microlens 60 has been shifted, the center lines 375 and 605 no longer coincide as in FIG. 10, but there is a physical offset between them. This offset allows the shifted microlens 60, to shift more of the focused light onto the photodiode 35. Thus, although the angle of the incident light 560 is large, the shifted microlens 60 shifts more of the focused light to the photodiode 35 of the pixel site 30 so that the light collection efficiency is significantly increased.

However, when color filters are employed, as illustrated in FIG. 11, with an image sensor to enable production of a color image, it is preferred in accordance with the present invention that in addition to shifting of microlenses, the color filters underlying the microlens also be shifted, particularly for large chief-ray angles. If the color filter array (CFA) is not properly shifted, as shown in FIG. 11, it is possible that some light collected from a shifted microlens 60 could pass through an unintended color filter. By shifting the color filters relative, as illustrated in FIG. 12, to the array in the manner of the microlens, proportional to the filter optical height relative to the lens optical height, any color mixing effects due to unintended direction of incident light can be avoided.

Figure 12:
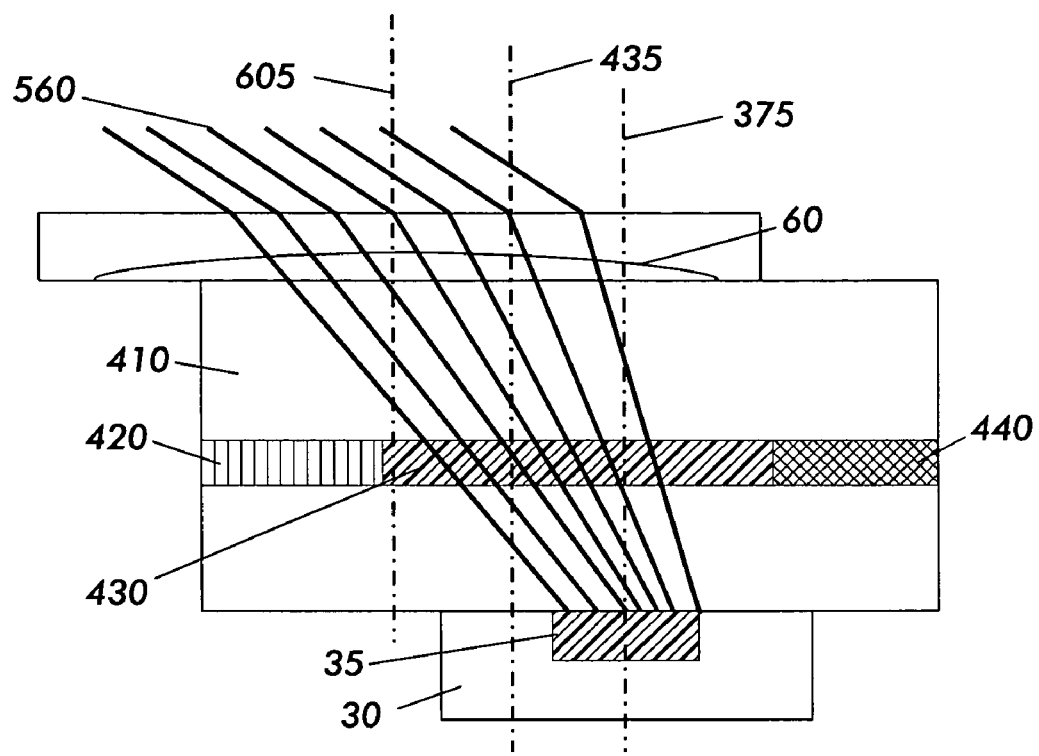
FIG. 12 graphically illustrates an example of light collection efficiency of an imager with non-telecentric lens with a shifted color filter array layer and shifted microlens according to the concepts of the present invention.

As illustrated in FIG. 12, light 560, from a non-telecentric lens (not shown) impinges upon a shifted or offset microlens 60 that focuses the light through a dielectric layer 410 and a shifted color filter array layer having shifted color filter areas 420, 430, and 440. Upon leaving the shifted color filter array layer, the light passes through another dielectric layer before being incident upon a pixel site 30 in which a photodiode 35 is located. It is noted that in the example of FIG. 12, the pixel site 30 has a center point or center line 375, the microlens 60 has a center point or center line 605, and the color filter area 430 associated with the photodiode 35 has a center point or center line 435.

Since the microlens 60 has been shifted, the center points 375 and 605 no longer line up as in FIG. 10, but there is a physical offset between them. Moreover, since the color filter area 430 of the color filter array has been shifted, the center points 375 and 435 no longer line up as in FIGS. 10 and 11, but there is a physical offset between them. These offsets allow the shifted microlens 60, to shift more of the focused light onto the photodiode 35 and the shifted color filter area 430 to filter the light without having the light pass through an unintended color filter. Thus, although the angle of the incident light 560 is large, the shifted microlens 60 shifts more of the focused light to the photodiode 35 of the pixel site 30 and the shifted color filter area 430 filters the light without having the light pass through an unintended color filter so that the light collection efficiency is significantly increased.

Figure 13:
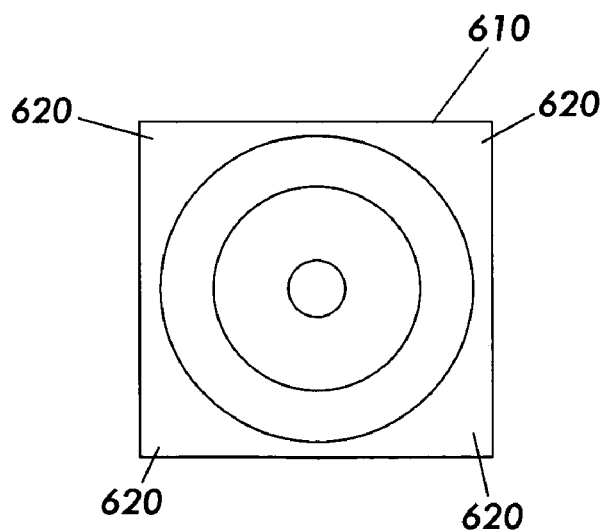
FIG. 13 illustrates a top view of a pixel site with a microlens.

Although the microlens and color filter shifting techniques described above are effective to some degree, they do not compensate for scattered incident light. This light scattering comes about due to the fact that the efficiency of a microlens is not 100%. The formation process for the lens typically results in a circular lens, while pixels are typically square. This geometric relationship results in nearly 25% of the pixel area not being covered by the microlens, as shown in FIG. 13, wherein the microlens 610 includes unfocused regions 620. As a consequence, some fraction of the incident light is not focused by the microlens 610, and this unfocussed, or stray, light passes instead through whatever photodiode happens to be in the trajectory of the light. When the microlens is shifted, this stray light can tend to impinge on the wrong pixel, resulting in optical crosstalk and color mixing between pixels. An example of this stray light impinging upon the wrong pixel, resulting in optical crosstalk and color mixing between pixels, is illustrated in FIG. 14.

Figure 14:
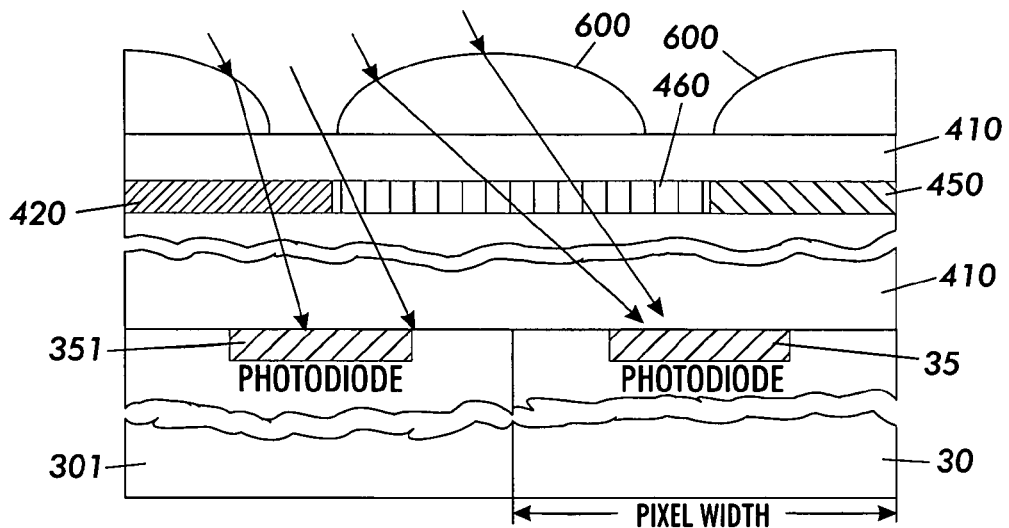
FIG. 14 graphically illustrates light collection of unfocused light.

As illustrated in FIG. 14, light passes through shifted microlens 600, dielectric layers 410 and shifted color filter areas 450, 460, and 470 before impinging upon photodiode 35 located in pixel site 30. However, light can bypass the microlens 600 and thus be unfocussed upon the proper pixel site. In such a situation, as illustrated in FIG. 14, the stray light may improperly be filtered by shifted color filter area 460 and impinge upon photodiode 351 in pixel site 301. It noted that shifted color filter area 470 is associated with photodiode 351 in pixel site 301, not shifted color filter area 460. As a result of this improper filtering, optical crosstalk and color mixing between pixels occurs.

Figure 16:
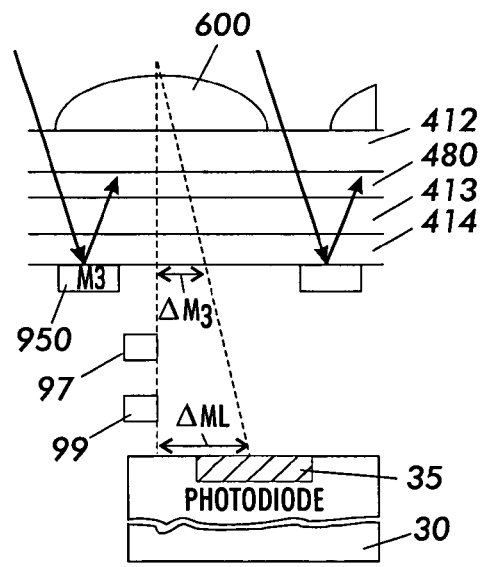
FIG. 16 illustrates an imager with a shifted microlens, a shifted color filter array, and a shifted aperture layer according to the concepts of the present invention.

The present invention overcomes this stray light condition to enable effective non-telecentric lens compensation with shifted microlenses whose geometry is not identical to that of the pixel, while at the same time compensating for stray incident light. In this compensation technique, an opaque, e.g., metal, aperture under the microlens is shifted. This aperture can be provided as the top-level metal layer of a CMOS image sensor process, or other suitable, preferably opaque, layer. The aperture layer is arranged in such a way that the light from the microlens passes through the aperture, but unfocussed light incident around the aperture that can cause color mixing is blocked, as shown in FIG. 16. As a result, the shifted metal or other aperture layer blocks a significant part of the light that does not pass through the microlens. This minimizes crosstalk. As a result, unfocussed light is substantially prevented from reaching an unintended pixel, and color mixing is prevented.

Figure 15:
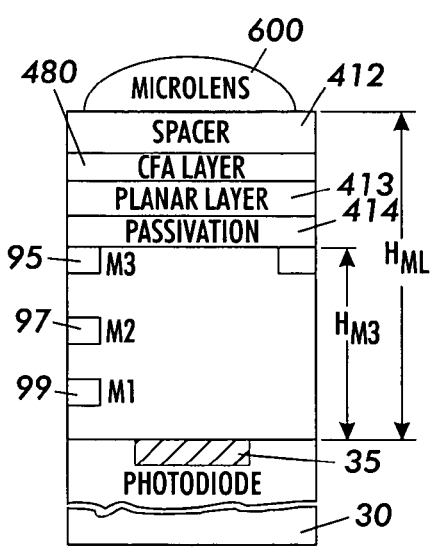
FIG. 15 illustrates an imager with a microlens, color filter array, and aperture layer.

FIG. 15 illustrates a typical imager structure that includes a non-shifted microlens 60, a spacer 412, a non-shifted color filter array layer 480, a planar layer 413, and a passivation layer 414. Below the passivation layer 414, there is an aperture layer consisting of a layer of metal aperture 95 and the other metal layers 97 and 99 below it are for signal routing. The height of the metal aperture layer, between the pixel site 30 and the passivation layer 414, is $H_{M3}$. The distance between the pixel site 30 and the microlens 60 is $H_{ML}$. In this typical structure, as noted above, the non-shifted aperture layer fails to block a significant part of the light that does not pass through the microlens as the chief ray angle is large. This causes crosstalk. As a result, unfocussed light is reaches an unintended pixel, and color mixing occurs.

FIG. 16 provides an embodiment, according to the concepts of the present invention, that includes shifted metal or other aperture layer which blocks a significant part of the light that does not pass through the microlens. This minimizes crosstalk. As a result, unfocussed light is substantially prevented from reaching an unintended pixel, and color mixing is prevented.

As illustrated in FIG. 16, an imager includes a shifted microlens 600 and a spacer 412. The imager also includes a shifted color filter array layer 480. In this embodiment, the aperture layer 950 is shifted so as to block a significant part of the light that does not pass through the shifted microlens 600. In a preferred embodiment of the present invention, this aperture layer 950 is a metal aperture layer.

Figure 18:
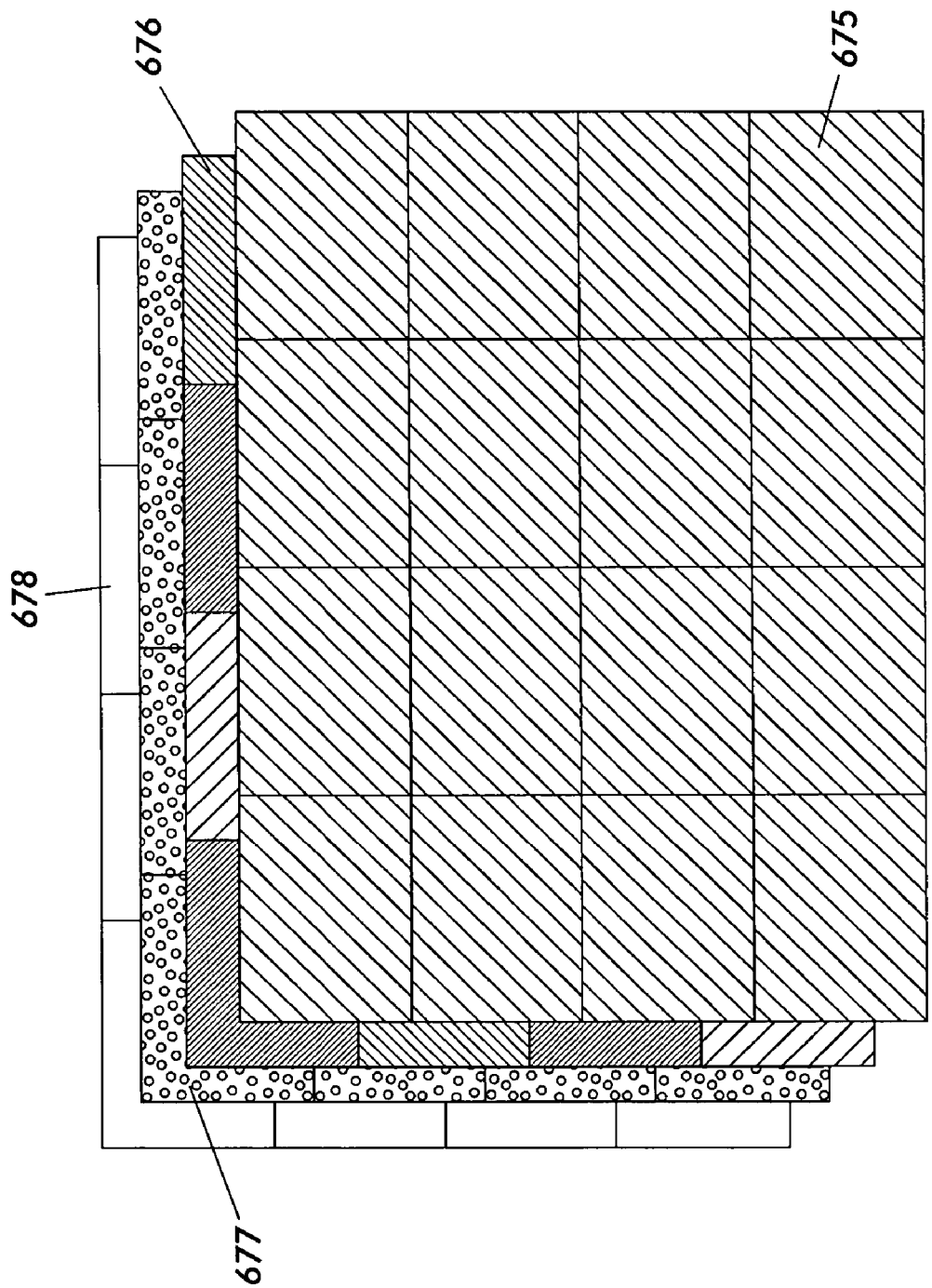
FIG. 18 graphically illustrates a top view of an imager with a shifted microlens, a shifted color filter array, and a shifted aperture layer according to the concepts of the present invention.

According to a preferred embodiment of the present invention, the metal shift geometry is derived from a corresponding lens shift as a metal shift distance that is proportional to the ratio of the metal layer height above the silicon substrate to the microlens height. Thus, if the metal level is height $H_{M3}$, as illustrated in FIG. 15, above the silicon surface, and the microlens is height $H_{ML}$ above the silicon surface, the shift of the metal pattern can be calculated as $$\Delta M_3 = \frac{H_{M3}}{H_{ML}} \cdot \Delta ML,$$

where $\Delta ML$ is the microlens shift. In this case, the metal layer is assumed to be the top metal, but this relation applies to any metal or other layer being employed as the aperture/shield. An example shift is illustrated from a top-down view in FIG. 18. In FIG. 18, the microlens array 675 is shifted or offset from the pixel site array 678. Moreover, the color filter array layer 676 and the aperture layer 677 are shifted or offset from the pixel site array 678. It is noted that no shift is preferred at the center of the pixel array.

It is noted that the chief ray angle of a non-telecentric lens may vary across the focal surface of the lens as a function of distance from the optical axis of the lens. To address this property of non-telecentric lens, one embodiment of the present invention varies the offset of each microlens spatially across the photosensor array relative to the associated photosensor such that the offset is a radial pattern relative to the optical axis of the lens. This embodiment of the present invention is illustrated in FIG. 19.

Figure 19:
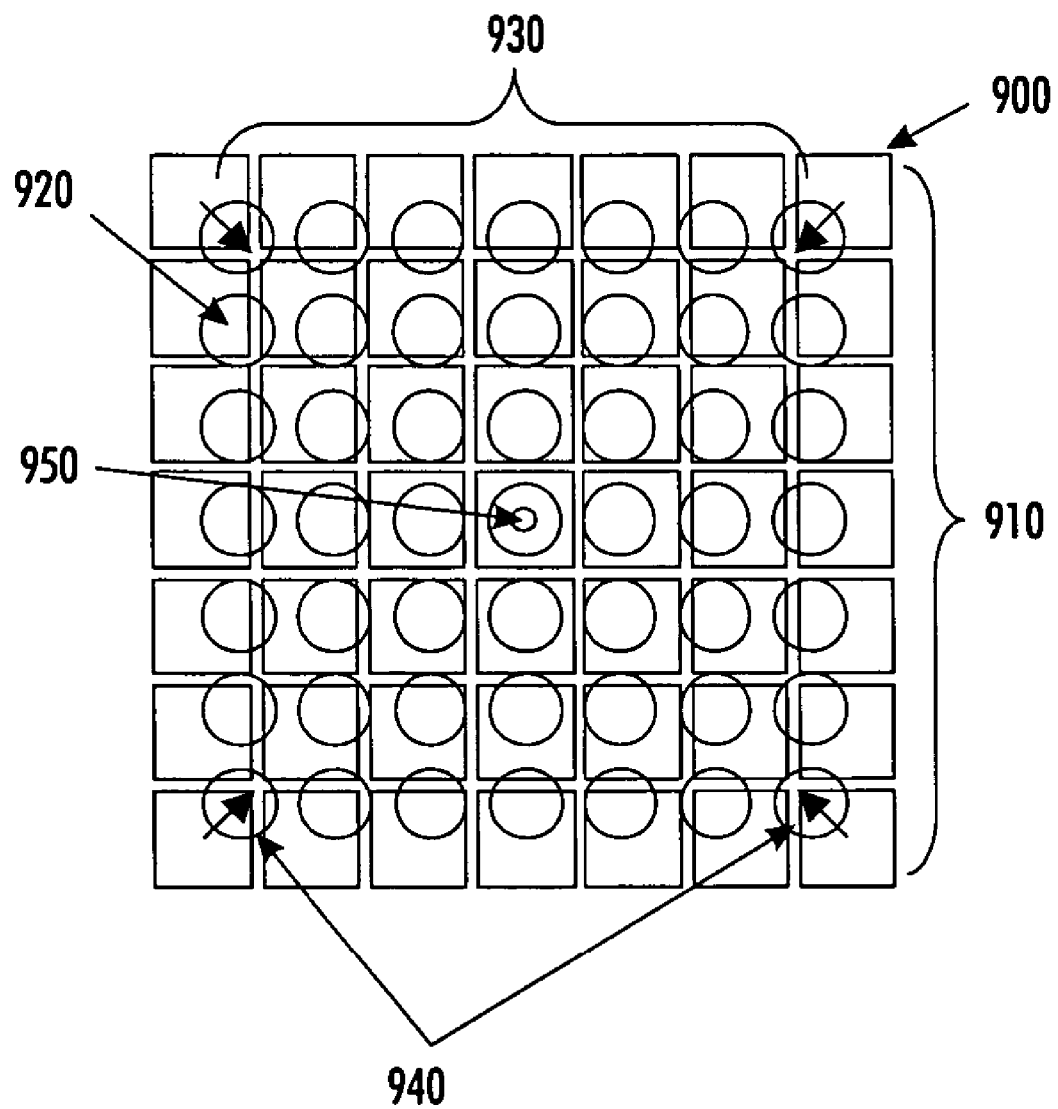
FIG. 19 illustrates an imager with a shifted microlens that varies in a radial pattern relative to the optical axis of the lens.

As illustrated in FIG. 19, photosensors 900 are arranged in an array 910. The associated microlenses 920 are also arranged in an array 930. Each microlens is offset from the associated photosensor by a distance 940 that varies according to the chief ray angle variation of the non-telecentric lens (not shown) as a function of radial distance from the optical axis. The optical axis coincides with the photosensor array 910 at a central point 950. It should be noted that the central point 950 in general may not coincide with the center point of a microlens or the center point of a photosensor.

It is recognized that microlens shapes can impact the degree of resulting stray light that is to be prevented. For example, an octagon-shaped microlens is understood to perform better than a square shape microlens, in terms of pixel-to-pixel crosstalk. This is because in lens fabrication, the patterning of an octagon-shaped microlens produces a circular-shaped lens after lens material reflow. The curvature is the same from all directions at any surface point. However, for a square-shaped microlens, the curvature is different along diagonal directions and horizontal/vertical directions. This deviation in curvature could result in differing refractive angles for light rays that are incident from different orientations, resulting in a higher degree of pixel-to-pixel crosstalk.

As described above, the present invention enables highly precise incident light focussing on an image sensor in a manner that inhibits pixel-to-pixel cross talk and color mixing. In accordance with the present invention, a microlens is shifted for better light collection efficiency when a non-telecentric taking lens is used. Further in accordance with the present invention, if an underlying color filter is employed with an imager, the color filter mosaic is also shifted to avoid color mixing. In addition, to further improve the performance, it is preferred in accordance with the present invention to utilize a shifted aperture layer, e.g., a metal layer with shifted apertures, to reduce crosstalk due to a scattering effect that results from light impinging substrate gaps between microlenses. An octagon-shaped microlens, rather than a square-shaped one, can be preferred to minimize crosstalk performance for its uniform curvature at the microlens surface.

In accordance with the present invention, any suitable technique can be employed to determine a shifting geometry. In one example, the CODE V optical simulation tool is utilized to calculate an optimized microlens shift. Before the simulation process is carried out, there are some critical parameters needed to construct the simulation condition. The parameters include microlens curvature, microlens height and size, and thickness and refractive index of each dielectric layer. The back focal length, lens aperture or f/stop, and chief ray angle characteristics versus image radius of the utilized non-telecentric lens are also required in the simulation.

The simulation is based on ray tracing principle. When a directional light ray hits an interface of two dielectric layers, the ray will be refracted and will therefore proceed with a different angle. The angle at which the ray continues depends on the wavelength of the light rays, the curvature of the interface, and the refractive index of the dielectric layers at both sides of the junction. The angles are quantitatively governed by Snell's law: $n_1 \cdot \sin(\theta_1) = n_2 \cdot \sin(\theta_2)$, where $\theta_1$, and $\theta_2$ are incident angle and refractive an $n_1$ and $n_2$ are refractive index of the dielectric layers. By calculating a large quantity of rays entering the optical system with various angles and locations, the performance of the system can be thus evaluated.

Figure 17:
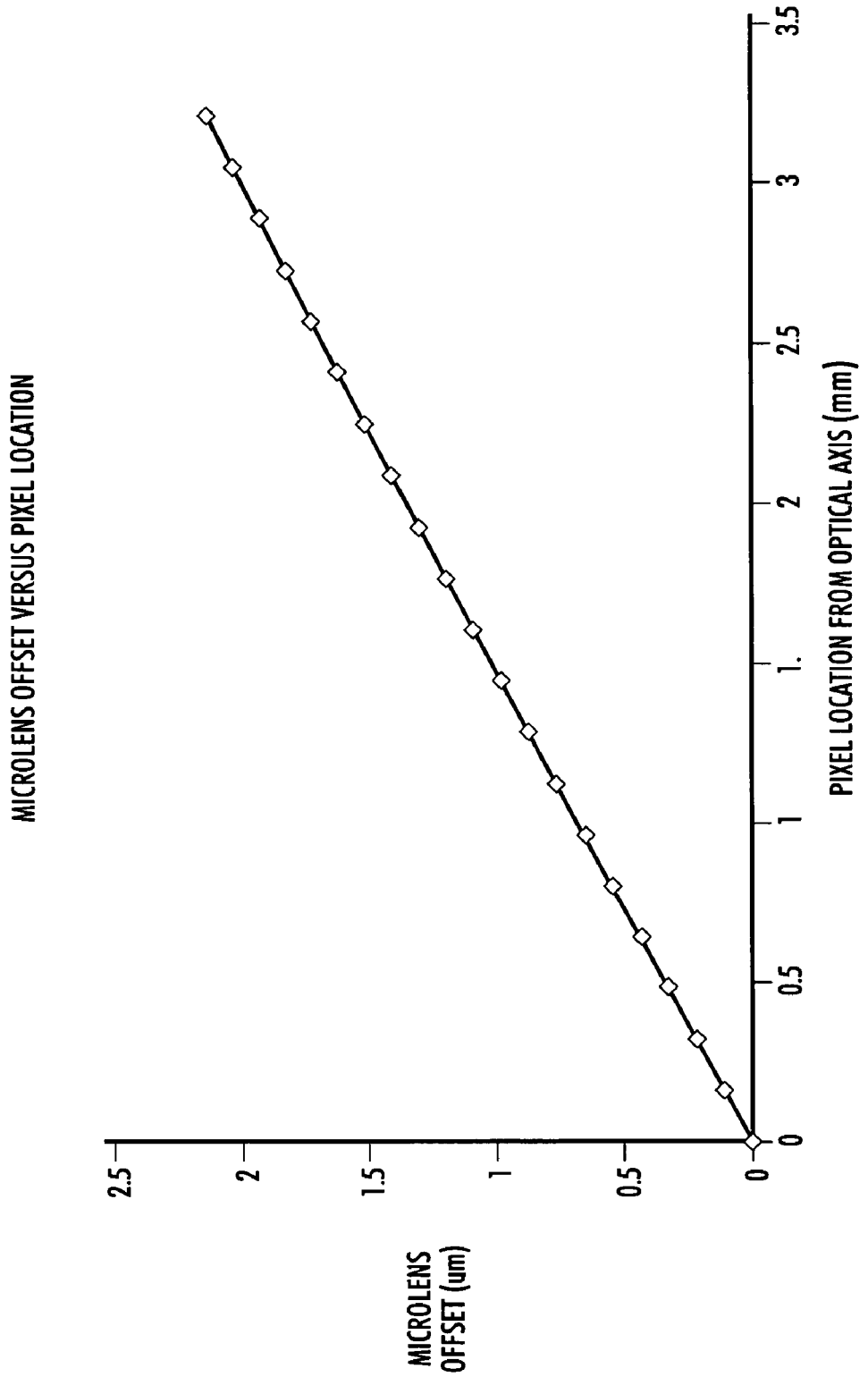
FIG. 17 graphically illustrates simulation results of microlens offset versus pixel location.

In the process of microlens shift optimization, the light rays that are initially focused by the taking lens onto the sensor surface will be re-focused by the microlens. It is noted that the re-focused rays will only be collected if the sensor is spatially offset from the microlens. From layout and silicon fabrication processing considerations, it is found that performing a microlens layout offset can be much easier than sensor layout offset. According to simulation results, the optimized offset quantity can be estimated by the locations at which chief rays, i.e., rays passing through the center of an entrance pupil and the center of the microlens, hit the silicon surface. FIG. 17 illustrates simulation results for microlens offset versus pixel location, for a situation where the chief ray angle varies linearly with distance on the focal plane from the optical axis. As shown in FIG. 17, a linear relation between pixel location and microlens offset is a good approximation. Such a linear relationship may not hold in all cases, e.g., where the chief ray angle variation is not a linear function of the distance from the optical axis on the focal plane.

In summary, the present invention includes a two-dimensional array of photosensors wherein each photosensor has a center point. The preferred embodiment of the present invention uses a non-telecentric lens that is positioned over the two-dimensional array of photosensors. A two-dimensional array of shifted microlenses is positioned over the two-dimensional array of photosensors. Each microlens is associated with a corresponding photosensor such that the center point of the microlens is offset from the center point of the corresponding photosensor. The offset may be uni-directional or two-dimensional. A shifted color filter array is positioned over the two-dimensional array of photosensors wherein the color filter array includes a plurality of color filter areas, each color filter area being associated with a corresponding photosensor. The color filter area is positioned over the corresponding photosensor such that the center point of the color filter area is offset from the center point of the corresponding photosensor. The offset may be uni-directional or two-dimensional. Lastly, a layer of shifted transmissive apertures is positioned over the two-dimensional array of photosensors, each aperture being associated with a corresponding photosensor and having a center point. The aperture is positioned over the corresponding photosensor such that the center point of the aperture is offset from the center point of the corresponding photosensor. The offset may be uni-directional or two-dimensional.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. An imaging system, comprising:
   a two-dimensional array of photosensors, each photosensor having a center point;
   a non-telecentric lens positioned over said two-dimensional array of photosensors; and
   a two-dimensional array of microlenses positioned over said two-dimensional array of photosensors, each microlens being associated with a corresponding photosensor, each microlens having a center point;
      said microlens being positioned over said corresponding photosensor such that a center point of a microlens is offset from a center point of a corresponding photosensor, each offset having an amount and a direction such that said amounts and directions spatially vary across said two-dimensional array of photosensors,
      said spatial variation being determined based on a variation of a chief ray angle of said non-telecentric lens across a focal surface of the non-telecentric lens and optical properties of said two-dimensional array of photosensors and said microlenses such that light sensitivity of each pixel is maximized; and
   a layer of transmissive apertures positioned over said two-dimensional array of photosensors, each aperture being associated with a corresponding photosensor and having a center point, wherein said layer of transmissive apertures is a metal layer of apertures such that the metal layer blocks stray radiation and the apertures allow radiation to pass therethrough.

2. The imaging system as claimed in claim 1, further comprising:
   a color filter array positioned over said two-dimensional array of photosensors.

3. The imaging system as claimed in claim 2, wherein said color filter array comprises a plurality of color filter areas, each color filter area being associated with a corresponding photosensor and having a center point;
   said color filter area being positioned over said corresponding photosensor such that said center point of said color filter area is offset from said center point of said corresponding photosensor, each offset having an amount and a direction such that said amounts and directions spatially vary across said two-dimensional array of photosensors;
   said spatial variation also being determined based said color filter areas such that crosstalk is minimized.

4. The imaging system as claimed in claim 1, wherein said aperture is positioned over said corresponding photosensor such that said center point of said aperture is offset from said center point of said corresponding photosensor, each offset having an amount and a direction such that said amounts and directions spatially vary across said two-dimensional array of photosensors;
   said spatial variation also being determined based on said apertures such that stray light signals are minimized.

5. The imaging system as claimed in claim 1, wherein the metal layer is a top-level metal layer of a plurality of metal layers.

6. The imaging system as claimed in claim 1, wherein the metal layer is an intermediate-level metal layer of a plurality of metal layers.

7. The imaging system as claimed in claim 1, wherein the metal layer is substantially planar.

8. The imaging system as claimed in claim 1, wherein said layer of transmissive apertures further comprises one or more other metal layers in addition to the metal layer forming a plurality of metal aperture layers such that the plurality of metal aperture layers allow radiation to pass therethrough while blocking stray radiation.

9. An imaging system, comprising:
- a two-dimensional array of photosensors, each photosensor having a center point;
- a non-telecentric lens positioned over said two-dimensional array of photosensors; and
- a color filter array positioned over said two-dimensional array of photosensors, said color filter array including a plurality of color filter areas, each color filter area being associated with a corresponding photosensor and having a center point,
    said color filter area being positioned over said corresponding photosensor such that said center point of said color filter area is offset from said center point of said corresponding photosensor, each offset having an amount and a direction such that said amounts and directions spatially vary across said two-dimensional array of photosensors, and
    said spatial variation being determined based on a variation of a chief ray angle of said non-telecentric lens across a focal surface of the non-telecentric lens and optical properties of said two-dimensional array of photosensors and said color filter areas such that crosstalk is minimized; and
- a layer of transmissive apertures positioned over said two-dimensional array of photosensors, each aperture being associated with a corresponding photosensor and having a center point, wherein said layer of transmissive apertures is a metal layer of apertures such that the metal layer blocks stray radiation and the apertures allow radiation to pass therethrough.

10. The imaging system as claimed in claim 9, wherein said aperture is positioned over said corresponding photosensor such that said center point of said aperture is offset from said center point of said corresponding photosensor, each offset having an amount and a direction such that said amounts and directions spatially vary across said two-dimensional array of photosensors;
    said spatial variation also being determined based said apertures such that stray light signals are minimized.

11. The imaging system as claimed in claim 9, wherein the metal layer is a top-level metal layer of a plurality of metal layers.

12. The imaging system as claimed in claim 9, wherein the metal layer is an intermediate-level metal layer of a plurality of metal layers.

13. The imaging system as claimed in claim 9, wherein the metal layer is substantially planar.

14. The imaging system as claimed in claim 9, wherein said layer of transmissive apertures further comprises one or more other metal layers in addition to the metal layer forming a plurality of metal aperture layers such that the plurality of metal aperture layers allow radiation to pass therethrough while blocking stray radiation.

* * * * *